United States Patent [19]
Ference et al.

[11] Patent Number: 5,926,029
[45] Date of Patent: Jul. 20, 1999

[54] ULTRA FINE PROBE CONTACTS

[75] Inventors: Thomas G. Ference, Essex Junction; Wayne J. Howell, Williston, both of Vt.

[73] Assignee: International Business Machines Corporation, Armonk, N.Y.

[21] Appl. No.: 08/863,268

[22] Filed: May 27, 1997

[51] Int. Cl.⁶ ............................. G01R 31/02; G01R 31/26
[52] U.S. Cl. ........................... 324/762; 324/757; 324/765
[58] Field of Search .................................. 324/754, 757, 324/760, 762, 765

[56] References Cited

U.S. PATENT DOCUMENTS

| | | | |
|---|---|---|---|
| 4,912,399 | 3/1990 | Greub et al. | 324/158 P |
| 4,922,192 | 5/1990 | Gross et al. | 324/158 P |
| 5,020,219 | 6/1991 | Leedy | 29/846 |
| 5,180,977 | 1/1993 | Huff | 324/158 P |
| 5,239,260 | 8/1993 | Widder et al. | 324/158 P |
| 5,422,574 | 6/1995 | Kister | 324/754 |
| 5,428,298 | 6/1995 | Ko | 324/762 |
| 5,625,298 | 4/1997 | Hirano et al. | 324/754 |

*Primary Examiner*—Glenn W. Brown
*Attorney, Agent, or Firm*—Thornton & Thornton; Francis J. Thornton; Robert A. Walsh

[57] ABSTRACT

This discloses a probe structure which does not rely on cantilevered wire and which has improved and controlled contact pressure between the probe tip contacts and the I/O pads on a semiconductor chip and which comprises a plurality of conductive contact electrodes, electrically coupled to respective leads, formed on a film stretched across a respective plurality of through holes established in a substrate. The through holes and the contact electrodes are aligned with one another and both positionally match selected I/O pads existing on a semiconductor chip to be probed. Also disclosed is a probe utilizing means connected to each one of the holes to control the pressure in the holes and between the probes and any contact on a device in contact with the probe.

11 Claims, 8 Drawing Sheets

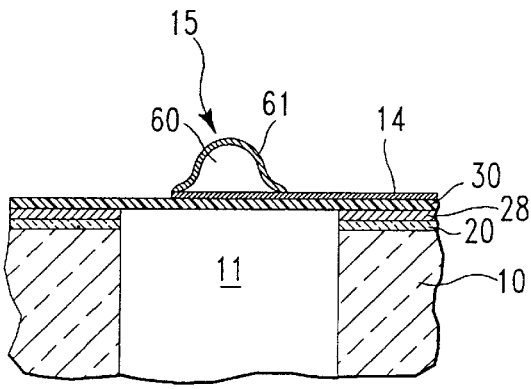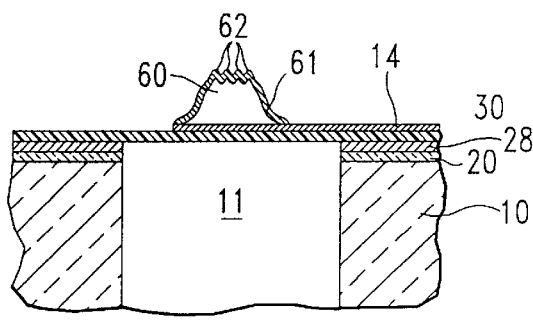
FIG. 13    FIG. 14
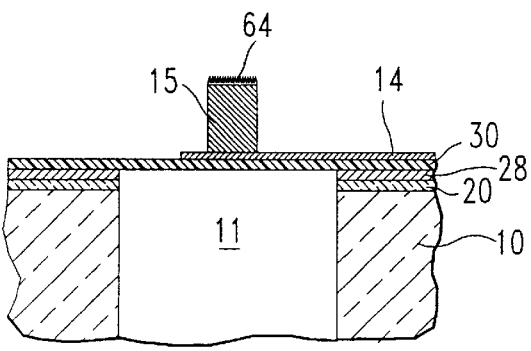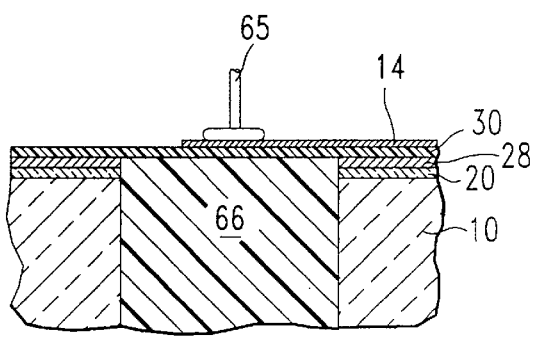
FIG. 15    FIG. 16
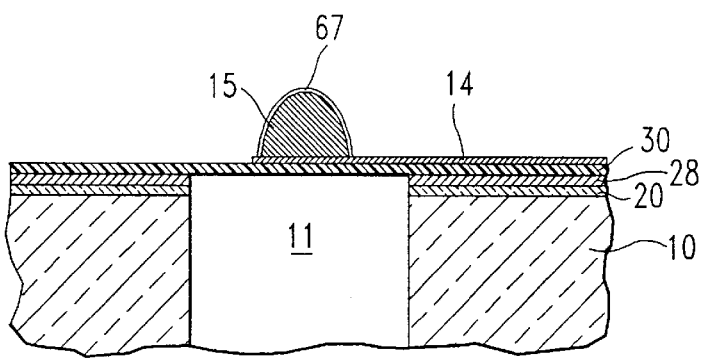
FIG. 17

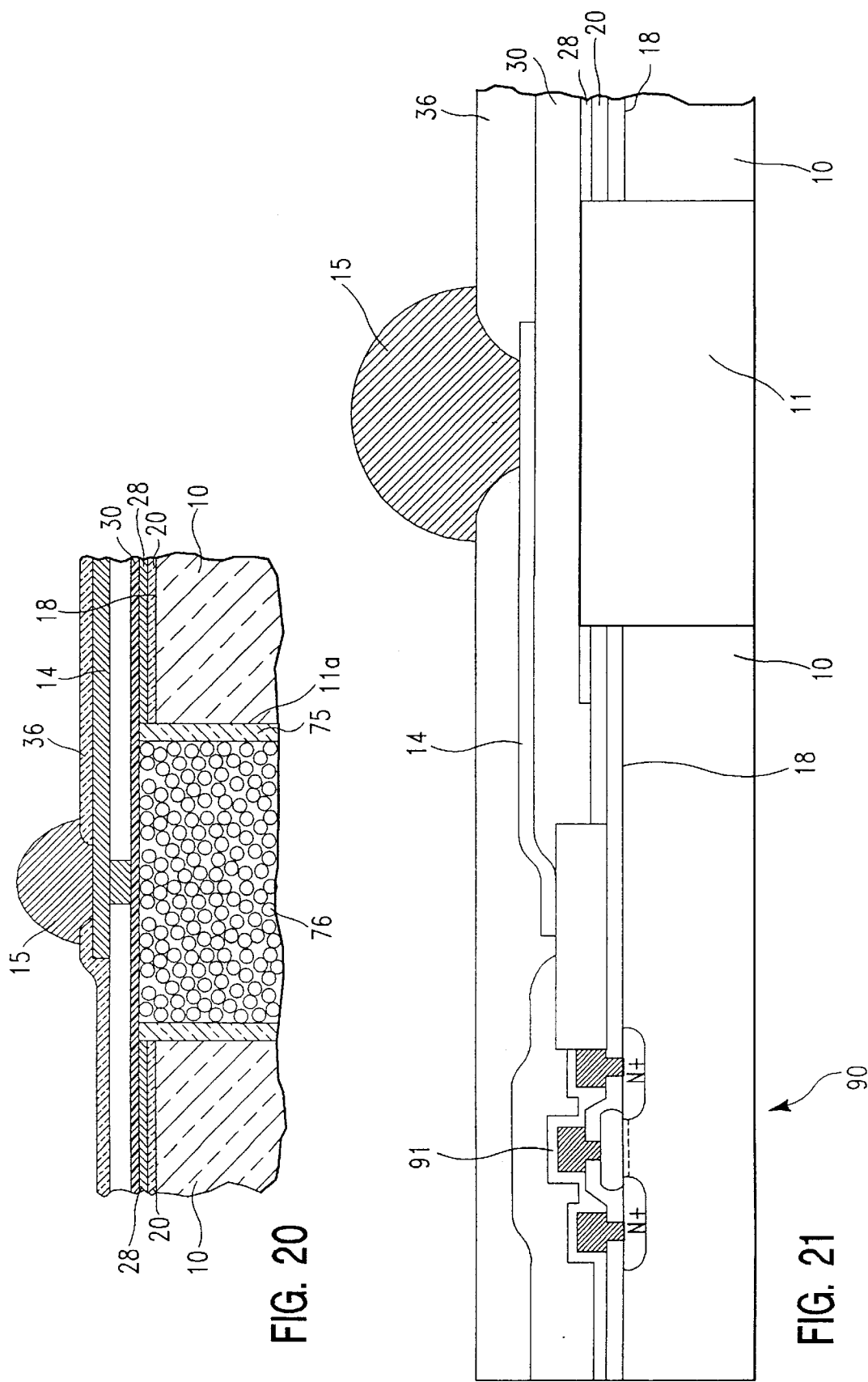

ULTRA FINE PROBE CONTACTS

FIELD OF THE INVENTION

The invention generally relates to probes and more particularly to probes used for contacting semi-conductor chip pads to temporarily provide the chip pads with electrical inputs from an external source.

BACKGROUND OF THE INVENTION

In semi-conductor manufacturing, chips, after fabrication, are usually probed to check their electrical characteristics. As the density of the input/output pads on the chips increases such probing of the chips becomes more and more difficult.

One type of prior art probe is formed on the surface of a substrate typically formed of a semiconductor, such as silicon, or an insulating material. The probe is comprised of a plurality of metallic lines connecting contacts or electrodes, in the form of bumps or tips, to respective signal pads connected to an external tester or other signal source. The probe tips are positioned to contact the Input/Output (I/O) pads on a chip to be tested.

Probes, so formed, were found to be unacceptable for they are rigid and non-compliant and fail to compensate for differences in height between the I/O pads on the chip or wafer being tested and the rigid probe tips.

In an attempt to overcome this difficulty such probes can be over driven, that is, forced into the chip pads, in order to assure good contact between the chip pads and probe contacts. This over driving of the probe, however, was found to significantly damage both the probe tips and the chip it was contacting thus increasing the possibility of damage to both the probe and the chip being tested resulting in poor chip test yields and damaged probes.

In an attempt to overcome the flexibility problem, B. Leslie, et al., described, in an article entitled "Membrane Probe Card Technology for VLSI Wafer Testing" which was given at the 1988 International Test Conference, pp. 601–607, a new probe in which both the contact electrodes and interconnecting wiring were formed on a flexible film. It was believed that by applying pressure from a side opposite to the contact electrodes improved contact between a pad and a probe would be achieved. A similar device was disclosed in an article by M. Beiley, et al.; entitled "Array Probe Card," Multi-Chip Module Conference, pp. 28–31, 1992 and in U.S. Pat. No. 5,103,557 by G. J. Leedy, et al.

However, the probes, described in these articles, were found to also have contact electrode pressure problems. It was found that uniform contact electrode pressure on the pads could not be made due to the excessive flexibility of the entire film. In addition, probes formed from flexible film as described in the papers and patent cannot achieve the wiring density necessary to test high I/O chips.

Still another probe arrangement is described in patent application Ser. No. 08/321,503, now U.S. Pat. No. 5,625, 298, which is assigned to the same assignee as the present invention. In this invention a small cavity was formed in the underlying substrate and a thin elastic film formed thereover. However, this method suffers from severe problems in forming the film across the mouth of the cavity. For this reason it was found to be unsuitable for use in a manufacturing or mass production setting.

Thus, there still exists a need for a probe which overcomes the manufacturing and contact problems encountered by the prior art and which can be readily adaptable for both individual chip or full wafer probing and can be easily, quickly and inexpensively produced for use in manufacturing as well as being provided with test circuitry.

SUMMARY OF THE INVENTION

The present invention discloses a probe structure, suitable for testing semiconductor chips. The probe can also be adapted to test individual chips either separated from one another or while they are still combined on a wafer. The probe of the present invention, can be readily formed on a substrate using presently available semi-conductor, thin-film processes well known to the art.

The probe structure, of the invention, is formed on a substrate and is comprised of a plurality of probe tip contacts, positionally matching the I/O pads on the semi-conductor chip to be tested, formed on a thin compliant film spanning through holes in the substrate and connected by conductive leads to probe pads which are adapted to be connected to an external tester. The film, being compliant, will be pushed down into the underlying hole, when there are variations in I/O pad heights on the chip under test. The film thus provides an elastic force between the probe tip contacts and the chip I/O pad. This arrangement thus assures that there is uniform contact between the probe tip contacts and the pads on the chip being tested even though there are height differences in either or both the chip pads or the probe tip contacts or in variable ambient conditions.

Still further the present invention permits dynamic control of the contact pressure and position of individual probe tip contacts during test and burn-in procedures.

BRIEF DESCRIPTION OF THE DRAWINGS

FIG. 13 shows a third embodiment of a probe tip contact according to the invention;

FIG. 14 shows a fourth embodiment of a probe tip contact according to the invention;

FIG. 15 shows a fifth embodiment of a probe tip contact according to the invention;

FIG. 16 shows a sixth embodiment of a probe tip contact according to the invention;

FIG. 17 shows a seventh embodiment of a probe tip contact according to the invention;

FIG. 20 shows still another embodiment of a probe tip contact according to the invention;

FIG. 21 shows still another embodiment of a probe tip contact, according to the invention, in which is integrated with active control circuitry;

DESCRIPTION OF THE INVENTION

Turning now to the drawings and particularly to FIGS. 1 to 7 thereof, an embodiment of the present invention and the process of its formation will be described in detail.

Figure 1:
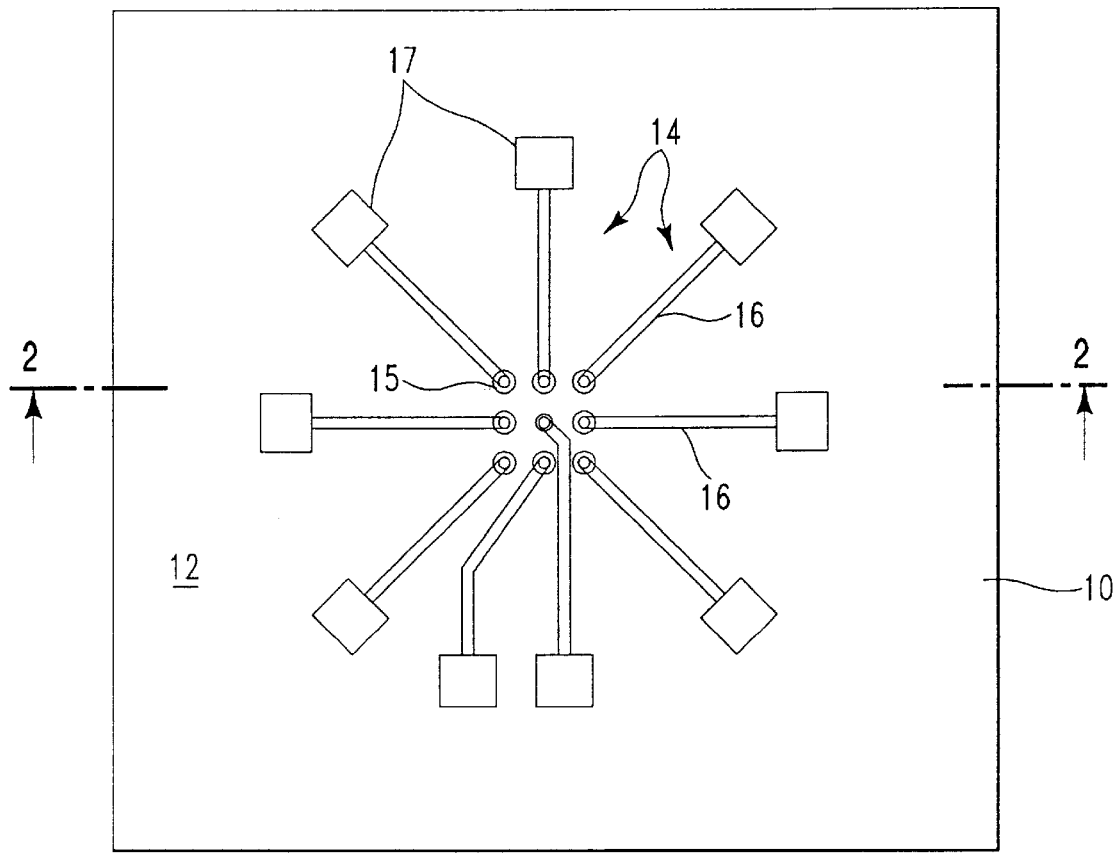
FIG. 1 is a top view of a probe made in accordance with the invention.
Figure 2:
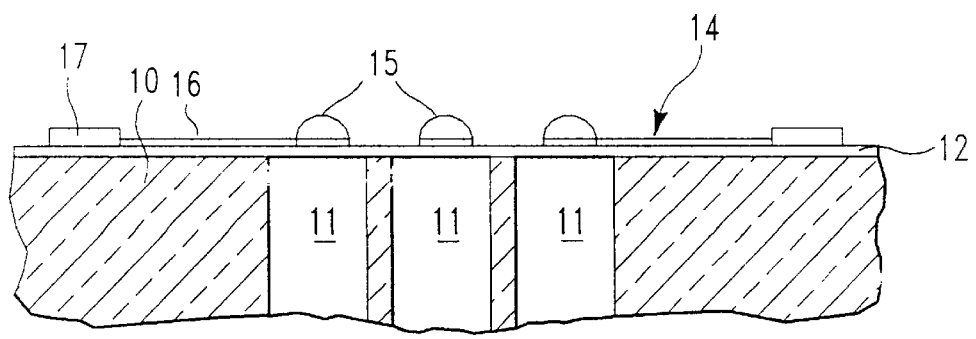
FIG. 2 is a sectional view of FIG. 1 taken along the lines 2—2.

The probe of the invention, shown in FIGS. 1 and 2 is comprised of a substrate 10 having a plurality of through holes 11 formed therein, a thin, flexible, insulating film 12 disposed on a surface of the substrate and spanning each of the holes 11, and a plurality of probe elements 14 disposed on the upper surface of the film 12. Each probe element 14 is formed of metal and is comprised of a probe tip contact 15, on its proximal end, connected through conductor 16 to test probe pad 17 on its distal end. The probe pads 17 are adapted to be connected to an external tester (not shown) so that test signals may be received from the external tester. Each probe element 14 is arranged on the film 12 such that its respective probe tip contact 15 is positioned over a respective hole 11.

Turning now to FIGS. 3 to 7 a preferred process for producing the present invention will be described in detail.

Figure 3:
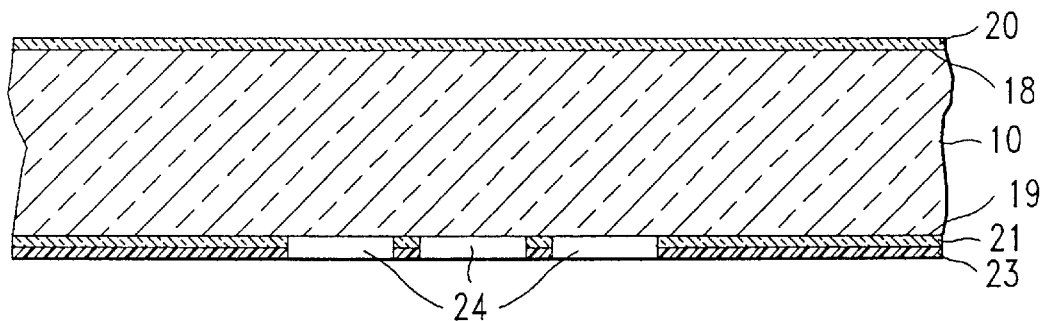
FIG. 3 shows the initial steps involved in the formation of a probe shown in FIGS. 1 and 2.

FIG. 3 is a sectional view of an non-conductive or semiconductive substrate 10. When formed of a semiconductor material the substrate preferably is silicon having a 110 crystal orientation. Although silicon is preferred as the substrate material, it must be noted that it can be formed of other materials so long as the material selected for the substrate can be treated to result in the probe as described herein. Furthermore, it should be understood that for burn-in or acceleration testing, it is very desirable that the coefficients of expansion of the probe substrate and the chip or unit to which it is to be coupled with are closely matched.

The substrate 10, when formed of silicon, is typically 725 micrometers ($\mu$m) thick and has two major, substantially planar surfaces 18 and 19 each of which is overcoated with a respective chemical vapor deposited layers 20 and 21 of Silicon Nitride ($Si_3N_4$) using techniques well known to the art. These layers of Silicon Nitride 20 and 21 should be at least 1 $\mu$m in thickness and may range upwards to 5 $\mu$m. A photoresist coating 23, again using known techniques, is applied over the silicon nitride layer 21. The coating of photoresist 23 on silicon nitride layer 21 is now exposed and developed, using well known photolithographic techniques, to form a desired pattern of openings 24 approximately 25 $\mu$m or larger in diameter through which selected portions of the underlying silicon nitride layer 21 is exposed. The substrate 10 is now processed in a plasma etching tool having a suitable preferential etchant plasma formed of $CHF_3$ and $O_2$ therein. This etchant attacks the Silicon Nitride ($Si_3N_4$) layer 21, where exposed in the openings 24, to extend the openings 24 through the silicon nitride layer 21 to expose regions on the silicon substrate surface 19.

Figure 4:
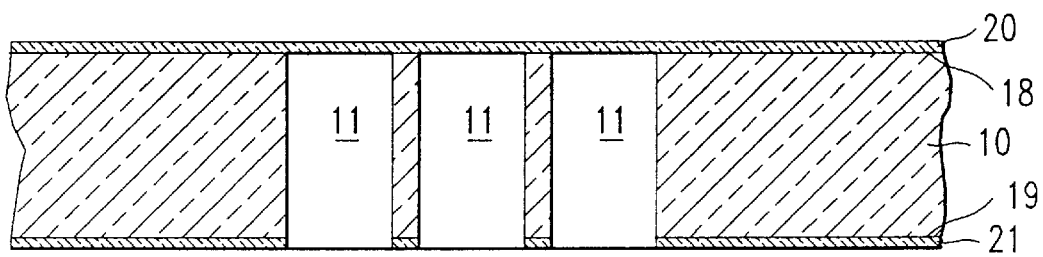
FIG. 4 shows the steps involved in creating through holes in the formation of a probe shown in FIGS. 1 and 2.

As shown in FIG. 4, the remaining photoresist 23 is now stripped using an ozone strip tool with another preferential etchant plasma of $O_2$ and $N_2O$. The $Si_3N_4$ layer 21, remaining on the surface 19, serves as a mask preventing etching of the silicon substrate 10 during the step discussed below.

The substrate 10 is now placed in a preferential etching bath comprised of ethanolamine, gallic acid, water, prolane, peroxide, and a surfactant as described in a paper entitled Wet Silicon etching with Aqueous Amine Gallates by H. Linde and L. Austin which appeared in the April 1992 issue of the Journal of the Electrochemical Society, Vol. 139, No. 4.

Another suitable preferential silicon etchant procedure is also described in an article entitled Vertical Etching of Silicon at Very High Aspect Ratios by D. L. Kendall which appeared in annual Review of Material science, 1979, 9: 373, 401.

The first of the above described enchant baths preferentially etches the 110 oriented silicon of the substrate 10, where exposed through openings 24, in a direction perpendicular to the wafer surface 19 at a rate 100 times faster than in a direction parallel to the surface 19 to form deep holes 11 in the substrate 10 as shown in FIG. 4. This preferential etchant thus assures that the holes 11 will extend perpendicularly through the entire thickness of the substrate 10 without being unduly wide. Thus the holes 11 are very deep with respect to their diameter which is not significantly greater than the diameter of the openings 24 previously formed in the Silicon Nitride ($Si_3N_4$) layer 21.

Because the above described enchants will not attack silicon nitride, the holes 11 terminate at the silicon nitride layer 20 overlying surface 18. Although the underlying silicon has been removed the layer 20, being of a sufficient thickness and strength, is self supporting across each of the formed holes 11.

Figure 5:
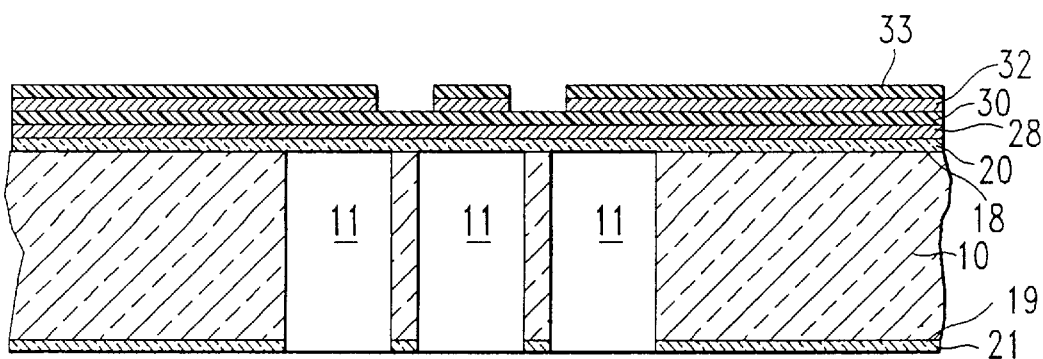
FIG. 5 shows the steps involved in creating the membrane and the conductive leads in the formation of the probe shown in FIGS. 1 and 2.

As shown in FIG. 5, a 100 to 1000 Å thick layer 28 of chromium is now evaporated over the silicon nitride layer 20. This chromium layer 28 is, in turn, coated with a polyimide membrane 30.

This membrane 30 can be formed of any one of a number of suitable alternative flexible materials including PBDA-PDA and PMDA-ODA polymers, various polyimide-silicone blends, polyurathane, and sylgard.

When this membrane 30 is formed of a PBDA-PDA polymer such as is sold by the DuPont de Nemours Corp. as its 2800 series, it must be at least 5 $\mu$m in thickness in order to provide, when cured, the minimum compliance and flexibility needed to assure good probe tip to chip pad contact. The thickness required by another flexible material may be different. It should also be noted that this thickness may be varied to change the compliance and flexibility of the membrane.

Following the deposition and curing of the flexible polyimide membrane 30 a 1 to 3 $\mu$m metallic layer 32 is deposited thereon. This metal layer 32 can be comprised of chrome-copper-chrome, titanium-tungsten-copper, or alloys of titanium and aluminum as commonly used in the semiconductor art. The deposition of such compound or multiply metallic layers is widely practiced and well known to those skilled in the semiconductor art.

Other low resistance metals, such as gold, copper, or their alloys may also be used.

Figure 6:
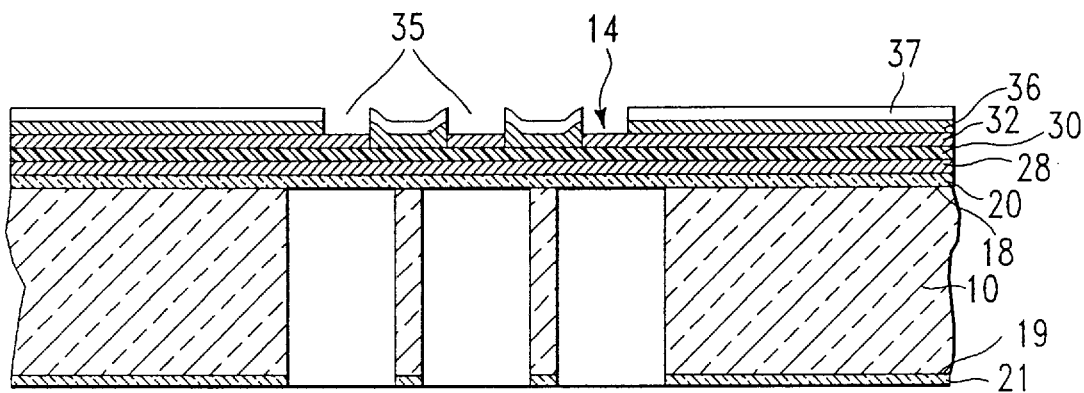
FIG. 6 shows the steps involved in creating the final passivation in the formation of the probe shown in FIGS. 1 and 2.

This metallic layer 32 is now coated with a layer of photoresist 33 which is exposed and developed to photolithographically define selected openings 34 therein that will permit, by well known etching processes, the formation of the probe elements 14 in the metallic layer 32 as shown in FIG. 6.

It should be noted that a multiplicity of metallic and polyimide layers can be deposited in order to provide multi-layer wiring levels as is known to the semiconductor art.

Once the probe elements 14 have been defined in the metal layer 32, the resist coating 33 is stripped, as shown in FIG. 6, and a second polyimide membrane 36 is coated over the defined probe elements 14. Over this polyimide layer 36 a suitable photoresist layer 37 is applied and openings 35 are photolithographically defined in the resist layer 37 where the contact element 15 are to be created. These openings 35 are extended through the polyimide layer 36 using a well known wet Tetramethylammoniahydroxide (TMAH) develop process to expose selected regions on the probe elements 14.

Once the openings 35 are so extended, the photoresist layer 37 is removed, i.e., stripped form the device and the polyimide layer 36 is cured using techniques known to the semiconductor art.

Figure 7:
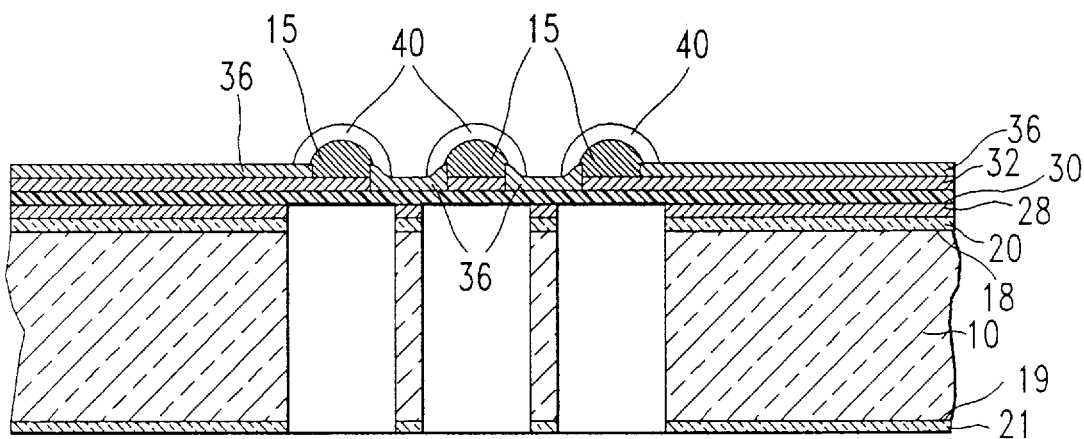
FIG. 7 shows a cross-section of a completed probe of the present invention.
Figure 8:
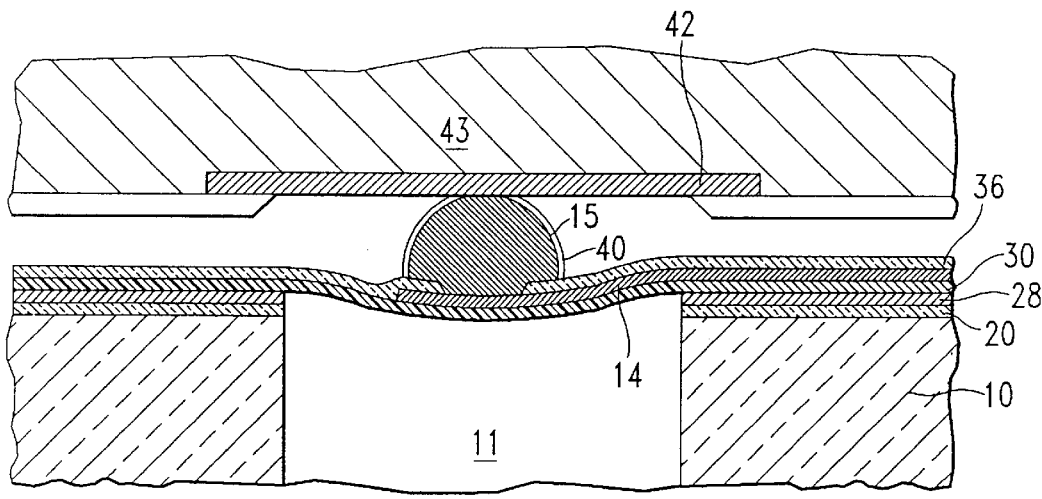
FIG. 8 is a sectional view of a completed probe tip contact touching an Input/Output pad on a semiconductor device to be tested.

Following the curing of the polyimide layer 36, the probe tip contacts 15, as shown in FIG. 7, are formed, to a selected height, by any suitable process, e. g. by plating a metal in the openings 35, onto the exposed selected regions on the probe elements 14. Typically, such probe tip contacts are formed of nickel, copper, palladium or their alloys may be coated with a thin layer of gold 40. This gold layer 40 assures that good electrical contact can be made between the contact electrodes 15 and the corresponding I/O pads 42 on the unit 43 to be contacted or tested as shown in FIG. 8. This unit 43 may be for example a semiconductor chip or wafer.

Once the contact electrodes have been completed, the portions of the layer 20 of silicon nitride spanning the holes 11 are removed. This is done by exposing the layer 20 through the holes 11 to the above described $Si_3N_4$ plasma etch process. The etchant not only removes those portions of the layer 20 exposed in the through holes 11 but also removes the silicon nitride ($Si_3N_4$) layer 21 on the surface 19.

The removal of the portions of the layer 20 exposed in the through holes 11 exposes corresponding regions of the overlying chrome layer 28. These now exposed regions of chrome layer 28 are also removed using a well known wet etching process to complete the definition of the probe element wiring 14.

As shown in FIGS. 7 and 8, once the chrome layer 32 has been removed from over the through holes 11 there remains over the through hole 11 only the two polyimide membranes 30 and 36, a small portion of the probe element 14, and the probe tip contact 15. It should be understood that the amount that the contact electrode can flex is dependent on the type and thickness of the polyimide layers 30 and 36 and the width and thickness of that portion of the defined metal element 14 which extends over the opening 11 and the width of the hole 11. By varying the selection of the materials and varying these physical parameters thereof a wide range of flexibility in the probe can be realized.

Figure 9:
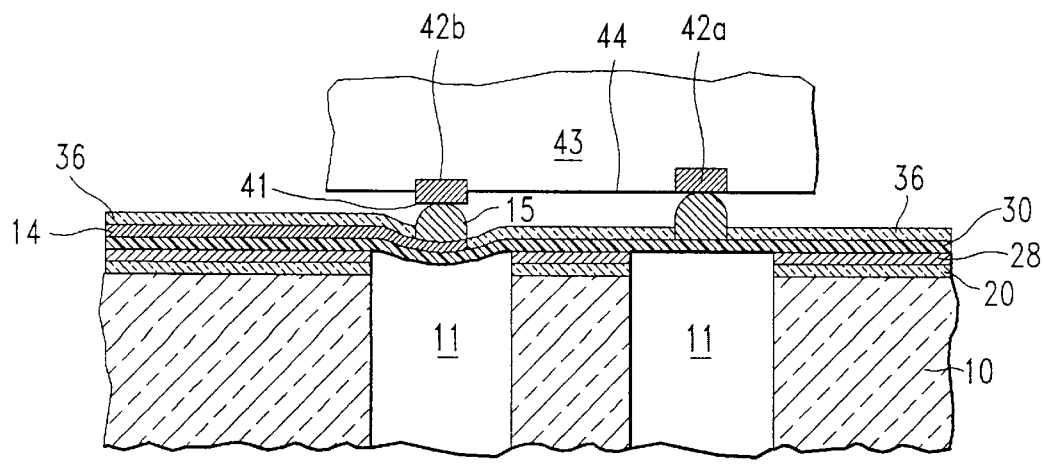
FIG. 9 is a sectional view of a pair of probe tip contacts touching an I/O pad on a chip being tested and illustrates a feature of a probe made according to the present invention.

As shown in FIG. 9, one surface 44 of the unit 43, to be tested, has a plurality of I/O (Input/Output) pads 42 of which only two, i.e., pads 42a and 42b are shown. These I/O pads 42 are connected to circuits (not shown) created in the semiconductor device 43 by techniques and in a manner well known to the semiconductor art. Each probe tip contact 15 on the surface of the probe is designed and positioned to contact a respective I/O pad 42 on the unit 43. As shown, probe tip contacts 15a and 15b are respectively aligned with and in contact with the respective I/O pads 42a and 42b. It should be noted that some tests do not require that each and every pad 42 on the unit 43 be contacted by a probe tip contact.

The removal of the rigid silicon nitride layer 20 and its over lying chrome layer 28 permits the remaining polyimide membranes 30 and 36 to flex when the contact electrode 15 is pressed against a respective chip pad thus compensating for variations in the heights of the unit I/O pad 42 and the probe tip contacts 15. Thus the through hole 11, positioned below each probe tip contact 15 acts in conjunction with the flexible film to provide a vertical, i.e. a spring, movement to each probe tip contact to compensate for height differences in the I/O pads 42 disposed on the surface of the unit being tested.

As shown in FIG. 9, one of the I/O pads, i.e., I/O pad 42b is shown slightly raised above the surface 44 creating a step difference 41. This step difference 41 is compensated for, by the opposing probe tip contact 15b being forced into the respective underlying through hole 11. Thus the present invention allows all the probe tip contacts and their opposing I/O pads to contact one another with only light force being applied between the probe and the chip under test. This prevents or at least significantly reduces the possibility of deforming either a pad or its corresponding probe tip contact.

It should be noted that, although only a simple, contact electrode arrangement for a single unit is shown in FIGS. 1 and 2, the principles discussed herein can, as will be further discussed below, be expanded to provide more complex and denser contact electrode arrangements for mating with denser more complex arrangement of I/O pads. The invention can also be expanded to provide a multiplicity of contact electrodes on a single substrate such as may be needed, for example, to simultaneously contact all the chips on a wafer.

Figure 10:
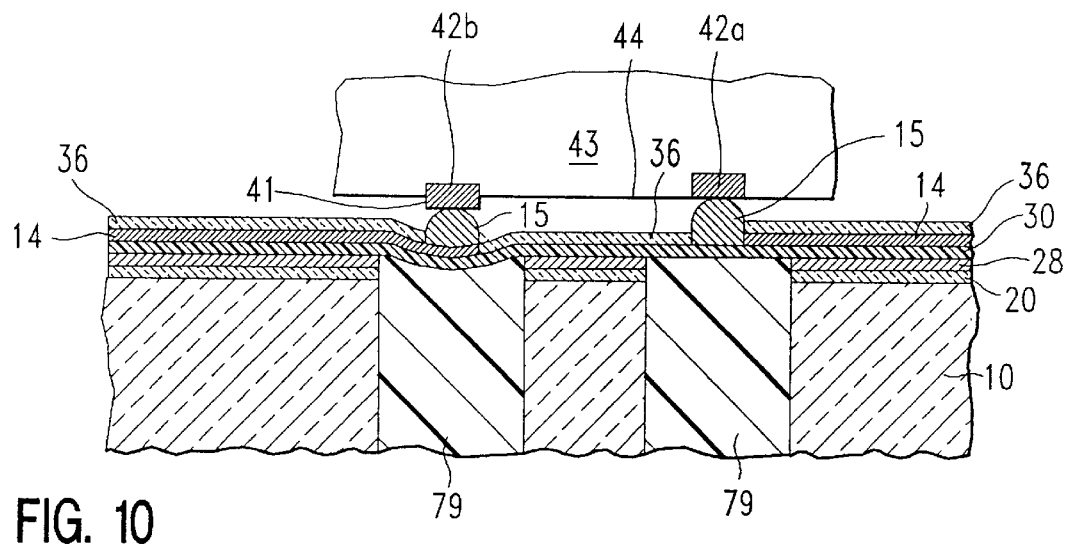
FIG. 10 is a sectional view of a different embodiment of a pair of probe tip contacts touching an I/O pad on a chip being tested and illustrates a feature of a probe made according to the present invention.

If desired, the through holes 11 can, as is shown in FIG. 10, be backfilled with a compliant material 79 such as silicone rubber thus enabling one to further tailor the compliance of the probe tip contacts and the force applied thereto when the probe is brought in contact with a unit to be tested. Prudent selection of the backfilling material provides a wide range of contact element compliancy.

Test and burn-in entails the applying of electrically stimulating signals to selected pads on the unit under test simultaneously while subjecting the unit to selected temperatures to induce failure in those circuits containing latent defects which would result in early field failure. Furthermore, when applying such test and burn-in to a plurality of chips, it is necessary to simultaneously apply identical selected signals to all the chips. To eliminate excessive wiring on the probe, signal I/O, power and ground connections buses are provided for each of the several chips being tested. When testing wafers this problem is intensified because of limited wiring areas available on the wafer and on the probe.

Moreover, some failures that occur during such test and burn-in result in electrical shorts either between the voltage (power and ground) planes or between the signal and voltage planes creates severe problems by creating an excessive power drain that adversely affect the testing. In prior art setups it is necessary to physically interrupt the test and physically remove the failed units from the bus in order to reduce this drain increasing test costs.

The present invention teaches an arrangement which is adapted to avoid this problem by dynamically controlling the positioning of individual probe tip contacts to and thereby permit their disconnection from a shorted chip without interrupting the test.

Figure 11:
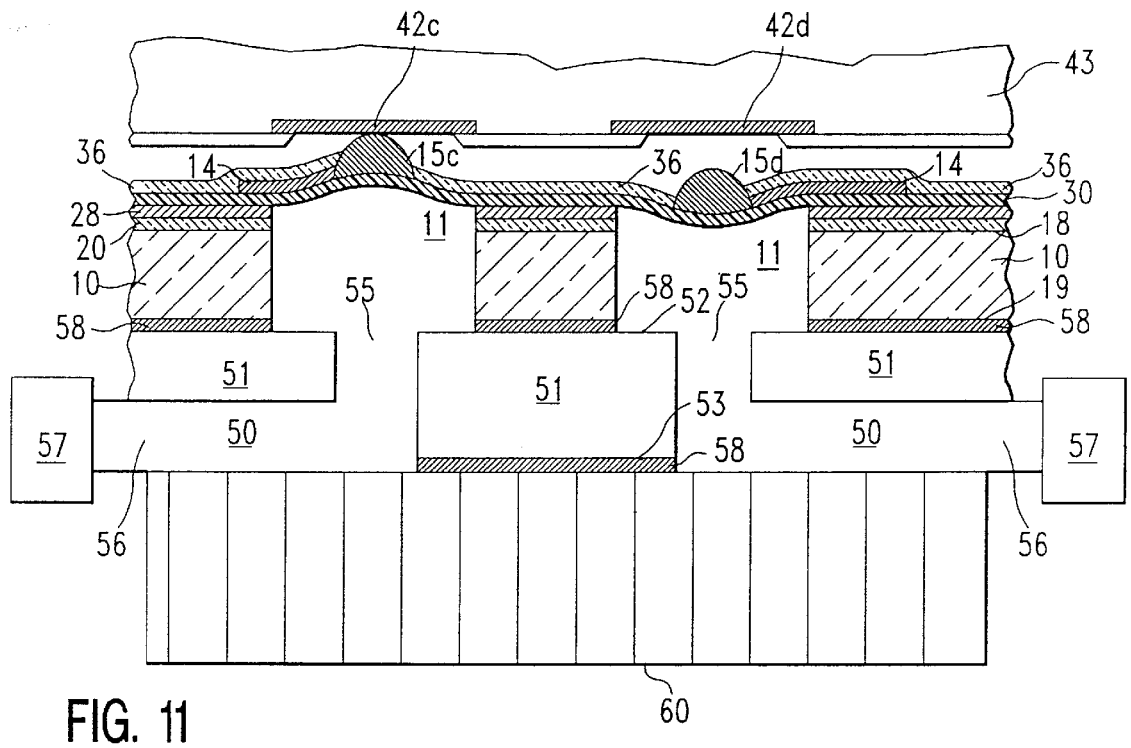
FIG. 11 shows a sectional view of two probe tip contacts further modified by the addition of pressure controls.

FIG. 11 shows such an embodiment of a probe, made according to the present invention, that permits such dynamic control of the individual tip contacts during test and burn-in procedures. In this FIG. 11 the probe is shown in contact with a chip 43 having I/O pads 42c and 42d. The probe shown in this FIG. 11 is provided with pressure channels 50 leading to the respective holes beneath the probe tip contacts 15c and 15d and providing, to the probe, the capability of dynamically controlling the contact pressure and position of selected ones of the probe tip contacts. This control enables one to vary in-situ the contacting of chip I/O pads 42c and 42d. This capability greatly increases the available electrical stimulations of the unit under test thus providing greater testing options than is available with prior art probes.

As shown, the probe is, in accordance with the present invention, comprised of a silicon substrate 10 having two major surfaces, i.e., an upper surface 18 and a lower surface 19 and a plurality of holes 11 passing there through. On upper surface 18 there is formed, as described above and shown in FIGS. 1–7, a flexible membrane 12 which spans the through holes 11 in the substrate 10. On the membrane 12 and above each through hole 11 there is positioned respective probe tip contacts 15c and 15d.

A quartz plate 51 having upper and lower surfaces 52 and 53 and a thickness in the range of 700 to 1000 μm is now selected and, using well known photolithography and quartz etching techniques, a plurality of channels 50 are formed in the quartz plate 51. Each of these channels connect at one end, i.e., the proximal end, to a respective one of a plurality of openings 55.

After the channels 50 and openings 55 have been suitably defined in plate 51, the surface 52 of plate 51 is affixed to the lower surface 19 of substrate 10 by a suitable layer 58 of organic adhesive such as is sold by The National Starch company under the trade name Thermid such that each opening 55 is positioned beneath a respective through hole 11 in probe substrate 10. The adhesive forms a pressure and vacuum tight seal between the surfaces 19 and 52.

Affixed to the lower surface 53 of the channeled quartz plate 51 with the above described organic adhesive 58 is a solid quartz or silicon plate 60. Suitable vacuum/pressure means 57 are attached to the distal end 56 of each of the channels 50 to control the height of the contacts probes. Thus as shown in FIG. 11, probe tip contact 15c has a positive pressure applied to force it against I/O chip pad 42c and probe tip contact 15d has a vacuum applied thereto to cause it to be withdrawn from and maintained out of contact with the I/O chip pad 42d.

Figure 12:
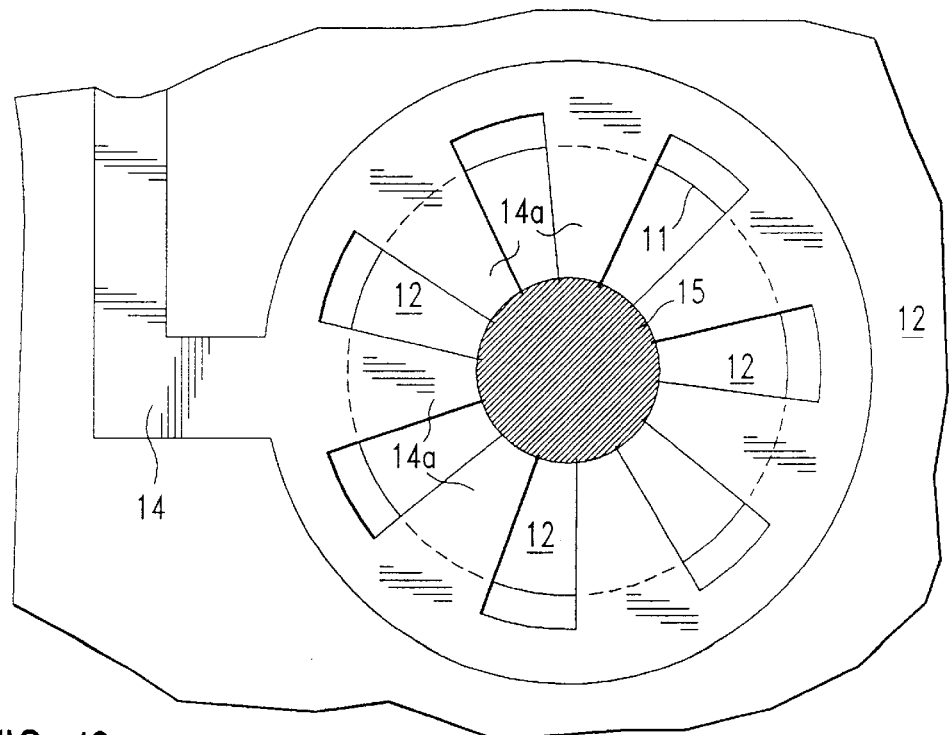
FIG. 12 shows a second embodiment of a probe tip contact according to the invention.

FIG. 12 shows still a different embodiment of the present invention wherein the compliant membrane 12 spanning a through hole 11 has an electrode 14 formed thereon such that it has a plurality of radial arms 14a connected at a central point below the probe tip contact 15. This structure gives more uniform flexibility and an improved reliability over multiple contact cycles than that which can be achieved with a single conductor element spanning the through hole as shown in FIG. 8.

FIG. 13 shows an embodiment of a probe wherein the probe tip contact 15 is formed of a photoactive polyimide 60 and coated with a metal layer 61. This provides a unique compliant contact electrode.

FIG. 14 shows a variation of the probe of FIG. 13 wherein the photoactive polyimide 60 is photolithographically defined with a series of ridges 62 in its top surface and coated with a metal layer 61. This provides a better gripping surface and assures a better electrical contact between the probe bump and the chip pad when contact there between is made.

FIG. 15 shows an embodiment of a probe with the contact electrode 15 formed as a cylindrical metal stud having a plating of dendritic material 64 formed on the top thereof.

FIG. 16 shows an embodiment of a probe tip contact 15 formed of a wire 65 bonded to the element 14. Such bonded probe tip contacts are well known and widely employed in the semiconductor art. To prevent the underlying membrane, spanning the holes 11, from being ruptured during the formation of this bonded probe the hole 11 should be backfilled with a suitable support material 66 such as is discussed above in conjunction with FIG. 10.

FIG. 17 shows an embodiment of a probe tip contact 15 coated with layer 67 of hard materials such as diamond particles or metal dendrites that will penetrate any oxides that may be existent on the surface of the pads of the semiconductor device under test.

Under selected conditions, the probe tip contacts, described in FIGS. 13 to 17, result in improved and more stable electrical contact between the probe tip contact and the I/O pad being contacted.

Figure 18:
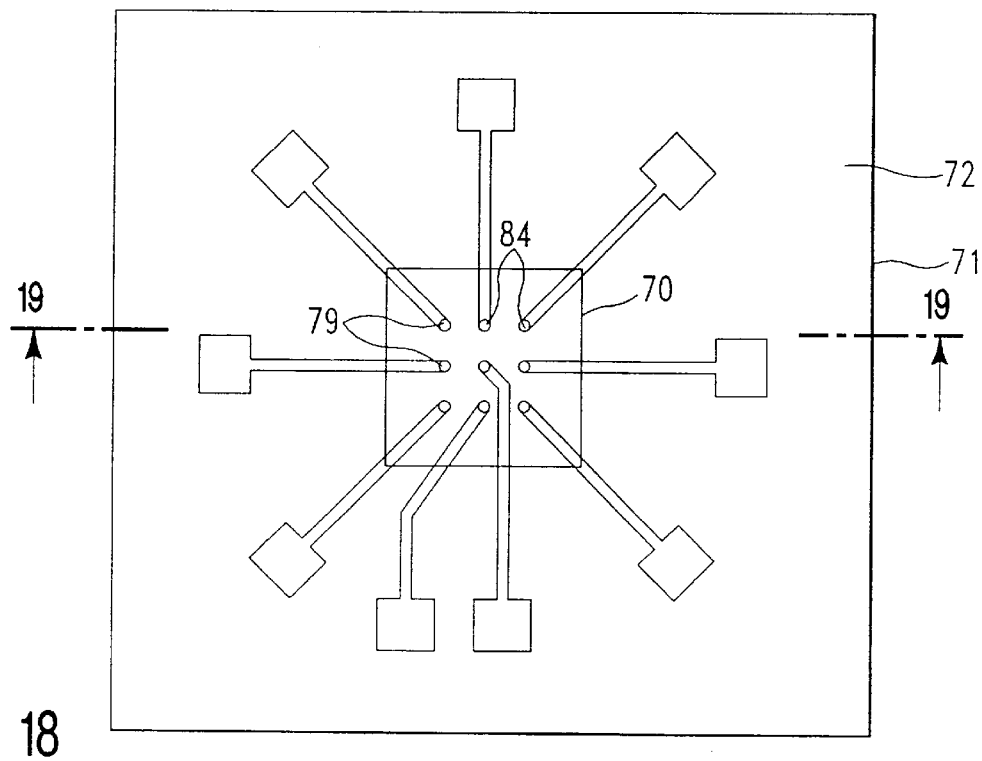
FIG. 18 is a top view of a different embodiment of a probe made according to the present invention.
Figure 19:
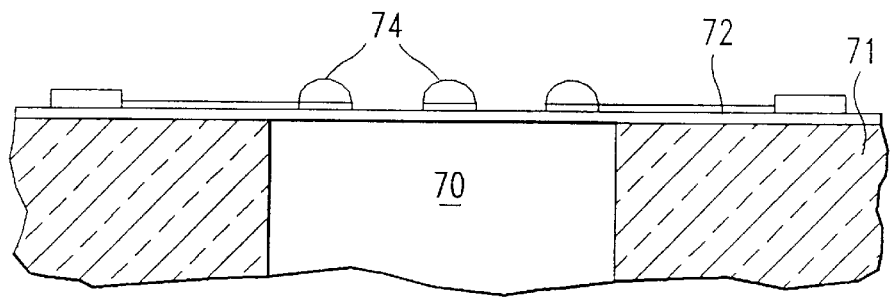
FIG. 19 is a side view of the completed probe of FIG. 17 taken along the lines 18—18.

FIGS. 18 and 19 depict still another embodiment of the present invention. In the embodiment shown in this drawing a single through hole 70 is formed in a substrate 71 and spanned with a compliant layer 72 as taught above, in accordance with the present invention. In this embodiment, however, the through hole 70 is significantly larger than the through hole 11 shown in the previous embodiments and the compliant layer 72, where it spans the hole 70 has a plurality of probe tip contacts 74 formed thereon.

FIG. 20 shows an embodiment of a probe contact 15 formed over and in contact with a conductive material 76 that backfills the hole 11. In order to create this device it is necessary that after formation of the through hole 11 that the wall 11a of the hole 11 be provided with a coating of insulating material 75, such as silicon dioxide, by any suitable method as is known to the semiconductor art. Following the formation of the material 75 on the wall 11a an opening is formed in the polyimide layer 30 after the oxide support 20 has been removed and the hole 11 is backfilled with a conductive material 76 having a desired resistivity. In this way contact can be provided between the probe element 15 and circuitry (not shown) formed on the back surface of the silicon body 10. This configuration permits the utilization of circuitry formed on the back surface and greatly extends the capabilities of the probe.

Additionally, one can utilize the probe assembly to measure the displacement at probe tip 15. The resistivity of conductive material 76 varies as a function of the pressure applied through the displacement of probe tip 15. Therefore the conductivity versus pressure calibration can be used to accurately determine the displacement of the probe tip 15.

FIG. 21 shows a probe tip contact 15 formed over and in contact with an electrical circuit 90 formed on surface 18 of the body 10 which in this instance is a silicon wafer. In order to create this device it is necessary that initially the circuit 90 be formed in the wafer 10 on its surface 18 using well known semiconductor processing techniques. The circuit 90, so formed, may be as simple as the Field Effect Transistor 91 coupled in series with the probe tip contact 15, as shown in FIG. 21, or can be the most complex of circuits including circuits such as driver circuits or logic circuits. After the formation of the circuit 90 the wafer is coated with silicon nitride and processed as above described to create the through hole 11 in the body 10 spanned by the membrane 30. This configuration permits the utilization of circuitry formed on the surface 19 to control the testing and/or burn-in of the wafers or units under test. This configuration dramatically reduces the requirements for high performance testers for now, most or all, the high performance test control or monitoring of the device under test may be performed on the probe itself.

This completes the description of the invention. Since changes may be made in the above described devices or processes without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A probe structure for testing semi-conductor chips, comprising:
   a substrate having first and second substantially major surfaces;
   a plurality of through holes formed in said substrate extending through said substrate from said first major surface to said second major surface;
   a flexible insulating film covering said first major surface of said substrate and spanning said holes; and
   a plurality of conductive means disposed on said flexible, insulating film, each of said conductive means having a first end extending over a respective one of said through holes and carrying a contact electrode positionally aligned with a respective pad on a semi-conductor chip.

2. The probe structure of claim 1 wherein;
   there is further provided a rigid insulating layer on said first major surface and beneath said flexible insulating film.

3. The probe structure of claim 2 wherein;
   there is further provided, a metallic layer on said rigid insulating layer.

4. The probe structure of claim 3 wherein;
   said flexible insulating film is selected from the class of materials consisting of PBDA-PDA and PMDA-ODA polymers, polyimide-silicone, polyurethane, and sylgard.

5. The probe structure of claim 4 wherein;
   said rigid insulating layer is formed of silicon nitride.

6. The probe structure of claim 5 wherein;
   there is further provided conductive leads on said flexible insulating film.

7. A probe structure for testing semi-conductor chips, comprising:
   a substrate having first and second major surfaces, each of said major surfaces lying in separated and substantially parallel respective planes;
   a plurality of through holes in said substrate extending between said first and second major surfaces;
   a flexible, compliant, insulating membrane of substantially uniform thickness formed on said first major surface and spanning across said through holes;
   a plurality of conductive elements formed on said flexible, compliant, insulating, membrane;
   each of said conductive elements having a proximal end and a distal end;
   said proximal end of each respective one of said conductive elements being aligned with and positioned over a respective one of said through holes, and carrying a probe tip contact positionally matched with a respective I/O pad on a semi-conductor chip to be probed;
   said distal end of each respective one of said conductive elements being connected to a test connection point; and
   means for connecting each of said through holes to respective vacuum/pressure means for controlling the position of said probe tip contacts with respect to the plane of said first major surface.

8. The probe structure of claim 7 wherein;
   said conductive elements are formed of a metal selected from the class consisting of chrome-copper-chrome, titanium-tungsten-copper, titanium, titanium alloys, aluminum or aluminum alloys.

9. A probe structure for testing semi-conductor chips, comprising:
   a substrate having first and second major surfaces, each of said major surfaces lying in separated and substantially parallel respective planes;
   an electrical circuit formed on one of said major surfaces;
   a plurality of through holes in said substrate extending between said first and second major surfaces;
   a flexible, compliant, insulating membrane of substantially uniform thickness formed on said first major surface and spanning across said through holes; and
   a plurality of conductive elements formed on said flexible, compliant, insulating membrane;
   each of said conductive elements having a proximal end and a distal end;
   said proximal end of each respective one of said conductive elements being aligned with and positioned over a respective one of said through holes, and carrying a probe tip contact positionally matched with a respective I/O pad on a semi-conductor chip to be probed and said distal end of each respective one of said conductive elements being connected to said electrical circuit.

10. A method of forming a probe comprising the steps of:
    selecting a substrate having first and second surfaces;
    forming a first substantially uniform, flexible film on said first surface by applying a high viscosity, liquid insulating material on said first surface;
    forming a second substantially uniform, flexible film on said second surface by applying a high viscosity, liquid insulating material on said second surface;
    forming a plurality of openings in said second uniform, flexible film on said second surface;
    etching a plurality of holes in said substrate through said openings in said second uniform, flexible film on said second surface, said holes extending from said first surface of said substrate to said second uniform, flexible film on said second surface of the substrate;
    forming a conductive layer on said second uniform, flexible film;
    forming a configuration of leads in said conductive layer, each of said leads having a proximal end and a distal end, the proximal end of each respective one of said leads being positioned over a respective hole in said substrate and the distal end of each respective one of said leads being positioned adjacent said holes; and forming a metal electrode over each one of each respective proximal ends by depositing a highly conductive, easily formed material thereon.

11. A method of forming a probe comprising the steps of:

selecting a substrate having first and second surfaces;

forming a first substantially rigid, uniform insulating layer on said first surface of the substrate;

forming a second substantially rigid, uniform insulating layer on said second surface of the substrate;

photolithographically defining a plurality of openings in said first substantially rigid, uniform insulating layer on said first surface of the substrate;

etching a plurality of holes in said substrate through said openings, said holes extending from said first surface of said substrate to said second substantially rigid, uniform insulating layer on said second surface of the substrate;

forming a first metallic layer on said second substantially rigid, uniform insulating layer on the substrate;

forming a first substantially uniform polyimide layer on said first metallic layer on the second substantially rigid, uniform insulating layer by applying a high viscosity, liquid polyimide on the surface of said first metallic layer;

baking said first substantially uniform polyimide layer to harden said first substantially uniform polyimide layer;

forming a second metallic layer on said hardened first polyimide layer;

forming, in said second metallic layer on said first polyimide layer, a plurality of metallic leads, each of said respective leads having a respective proximal end and a distal end by:

depositing a layer of a second metallic layer over the surface of the polyimide layer;

coating the second metallic layer with a layer of a first photoresist;

photolithographically patterning said first photoresist layer to establish a configuration of leads in said second metallic layer with the proximal end of each lead being positioned over a respective hole in said substrate;

defining said leads in said second metallic layer by etching said second metallic layer; and removing the remainder of the first photoresist layer;

forming a second layer of polyimide over said defined metallic leads and said first substantially uniform polyimide layer;

baking said second polyimide layer to harden said second polyimide layer;

forming a plurality of openings in said second polyimide layer by:

coating the second polyimide layer with a second layer of a photoresist;

photolithographically patterning said second photoresist layer to establish a configuration of openings in said second polyimide layer, with a respective opening positioned over the proximal and distal ends of each respective lead; and defining said openings in said second polyimide layer by etching said second polyimide layer;

removing the remainder of the second photoresist layer;

forming a generally hemispherical metal electrode in the opening formed in said second polyimide layer over said proximal ends by depositing a highly conductive, easily formed metal therein;

forming a plurality of openings in the second substantially rigid, uniform, insulating layer on said second surface of the substrate by removing said second substantially rigid, uniform, insulating layer through said holes in said substrate; and forming a plurality of opening in the first metallic layer on said second substantially rigid, uniform, insulating layer on said second surface of the substrate by removing the metallic layer on said second substantially rigid, uniform, insulating layer through said holes in said substrate.

* * * * *